(12) United States Patent  
Takegoshi et al.

(10) Patent No.: US 8,547,099 B2
(45) Date of Patent: Oct. 1, 2013

(54) METHOD AND APPARATUS FOR ACCURATELY ADJUSTING MAGIC ANGLE IN NMR

(75) Inventors: Kiyonori Takegoshi, Kyoto (JP); Takashi Mizuno, Kyoto (JP)

(73) Assignee: JEOL Ltd., Tokyo (JP)

( * ) Notice: Subject to any disclaimer, the term of this patent is extended or adjusted under 35 U.S.C. 154(b) by 421 days.

(21) Appl. No.: 12/885,861

(22) Filed: Sep. 20, 2010

(65) Prior Publication Data

US 2011/0080171 A1   Apr. 7, 2011

(30) Foreign Application Priority Data

Oct. 1, 2009   (JP) .................................. 2009-229190

(51) Int. Cl.
 *G01V 3/00*   (2006.01)
(52) U.S. Cl.
 USPC ........................................................ 324/309
(58) Field of Classification Search
 USPC ................................................. 324/300–322
 See application file for complete search history.

(56) References Cited

U.S. PATENT DOCUMENTS

| 3,530,373 | A | * | 9/1970 | Waugh | 324/311 |
|---|---|---|---|---|---|
| 3,530,374 | A | * | 9/1970 | Waugh et al. | 324/311 |
| 4,254,373 | A | * | 3/1981 | Lippmaa et al. | 324/321 |
| 5,298,864 | A | * | 3/1994 | Muller et al. | 324/321 |
| 5,325,059 | A | * | 6/1994 | Doty | 324/321 |
| 5,754,048 | A | * | 5/1998 | Bielecki | 324/321 |
| 5,760,586 | A | * | 6/1998 | Foerster et al. | 324/321 |
| 5,886,525 | A | * | 3/1999 | Yesinowski et al. | 324/321 |
| 6,118,274 | A | * | 9/2000 | Roffmann et al. | 324/321 |
| 6,653,832 | B2 | * | 11/2003 | Wind et al. | 324/307 |
| 6,806,713 | B2 | * | 10/2004 | Wong | 324/318 |
| 7,282,919 | B2 | * | 10/2007 | Doty et al. | 324/321 |
| 7,436,181 | B2 | * | 10/2008 | Krahn et al. | 324/321 |
| 7,535,229 | B2 | * | 5/2009 | Schlueter et al. | 324/318 |
| 7,915,893 | B2 | * | 3/2011 | Shevgoor et al. | 324/318 |
| 8,203,339 | B2 | * | 6/2012 | Johannessen et al. | 324/307 |
| 8,212,559 | B2 | * | 7/2012 | Armbruster et al. | 324/307 |

FOREIGN PATENT DOCUMENTS

JP   2009092424 A   4/2009

OTHER PUBLICATIONS

Mizuno et al., "2H Natural-Abundance MAS NMR Spectroscopy: An Alternative Approach to Obtain 1H Chemical Shifts in Solids", Journal of the American Chemical Society, 2006, pp. 9683-9686, vol. 128, No. 30.

* cited by examiner

*Primary Examiner* — Dixomara Vargas
(74) *Attorney, Agent, or Firm* — The Webb Law Firm (57) ABSTRACT

Method and apparatus for accurately adjusting the magic angle in NMR. The NMR probe has a uniform magnetic field coil assembly disposed to produce a uniform magnetic field H. The uniform magnetic field H is produced by controlling the currents flowing through the uniform magnetic field coil assembly. The vector sum of the external field $B_0$ and the uniform field H is used to determine a new external magnetic field $B_0'$.

9 Claims, 9 Drawing Sheets

0.3t x 2.8w  48 TURNS

FIG. 7D 0.3t X 2.8w 48 TURNS
RIGHT AND LEFT FOR EACH 1

RF PULSE
FOR EXCITATION

GAS

METHOD AND APPARATUS FOR ACCURATELY ADJUSTING MAGIC ANGLE IN NMR

BACKGROUND OF THE INVENTION

1. Field of the Invention

The present invention relates to a method and apparatus for accurately adjusting the magic angle used in NMR (nuclear magnetic resonance) spectroscopy and, more particularly, to a method and apparatus adapted to be applied to a high-resolution solid-state NMR spectroscopy system for accurately adjusting the magic angle in NMR experiments.

2. Description of Related Art

A nuclear magnetic resonance (NMR) spectrometer is an instrument for detecting atoms in a sample by placing it in an intense magnetic field, applying an RF magnetic field to the sample to induce a resonance in the atomic nuclei within the sample, and detecting a resonance signal at the resonant frequency. In a solid sample to be studied by NMR, molecular motions are constrained and, therefore, chemical shift anisotropy (shielding effects of electron clouds) and static dipolar interaction between nuclear spins are not fully averaged out.

Therefore, solid-state NMR measurements give rise to spectra with broad linewidths, making the analysis difficult. Accordingly, in high-resolution solid-state NMR, it is well known to cancel the aforementioned anisotropy and dipolar interaction by spinning a solid sample at a high speed of 3 to 20 kHz about an axis tilted at the magic angle (satisfying the equation $3\cos^2\theta - 1 = 0$) of about $54.74°$ with respect to an external magnetic field so as to average out electron clouds. This method is known as MAS (magic angle spinning).

Figure 8:
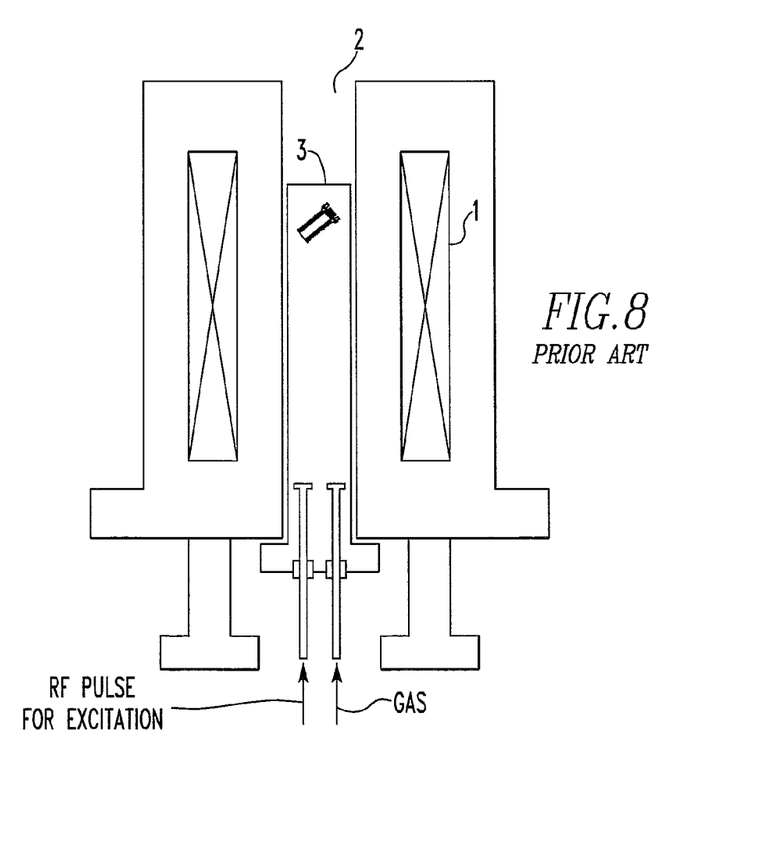
FIG. 8 is a schematic diagram of an NMR spectrometer using MAS (magic-angle sample spinning)
Figure 9:
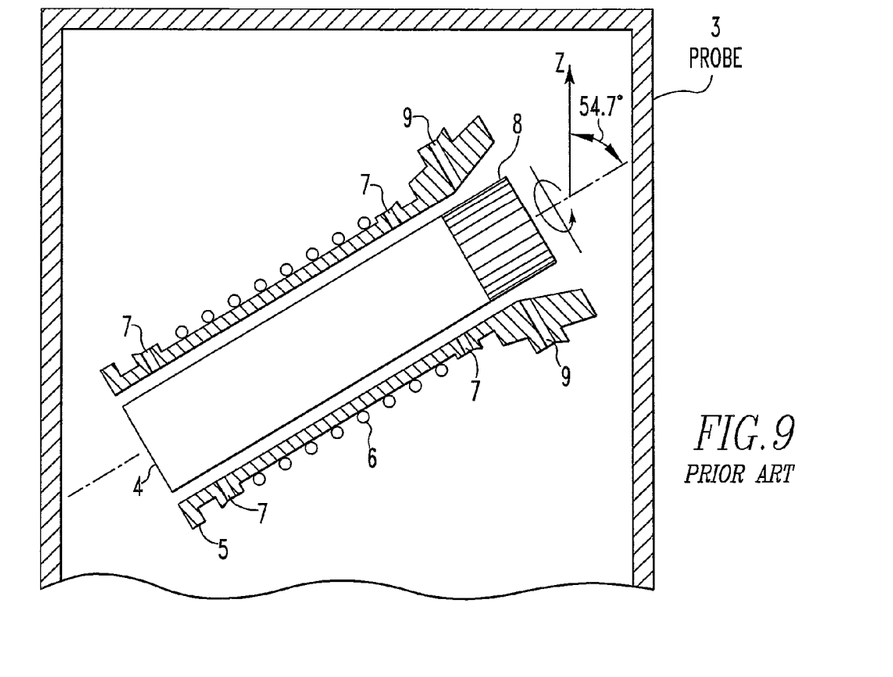
FIG. 9 is a detailed cross section of the probe shown in FIG. 8.

In particular, as shown in FIGS. 8 and 9, an NMR instrument utilizing MAS uses a probe 3 inserted in the bore 2 of a coil 1 producing a static magnetic field. A solid sample put in a sample tube 4 is excited with a pulsed signal by an exciting coil 6 disposed around the tube 4. The resulting FID (free induction decay) signal derived from the coil 6 is Fourier transformed to acquire a spectrum. The sample tube 4 is spun at high speed about an axis making the magic angle of about $54.74°$ to the direction Z of an external magnetic field as shown in FIG. 9.

Usually, the sample tube 4 is put into a stator tube 5. Gas supply holes 7 are formed in the opposite ends of the stator tube 5 to constitute an air bearing. High-pressure gas is supplied into the stator tube 5 through the holes 7 such that the sample tube 4 is rotatably held within the stator tube 5 while maintaining the magic angle. On the other hand, a turbine 8 is mounted at the top of the sample tube 4. Gas exhaust holes 9 are formed in positions opposite to the stator tube 5 to permit rotation of the turbine 8. High-pressure gas is similarly supplied through the exhaust holes 9 to spin the sample tube 4 at high speed.

Figure 10:
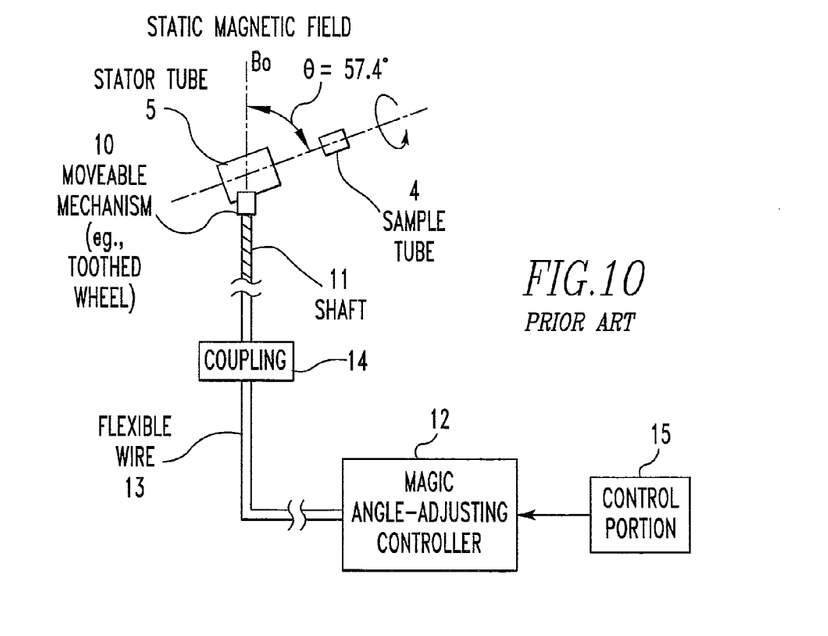
FIG. 10 is a schematic block diagram of a magic angle-adjusting mechanism.

FIG. 10 illustrates a magic angle-adjusting mechanism. In both FIGS. 9 and 10, like components are indicated by like reference numerals. The sample tube 4 holding a sample therein is inserted in the stator tube 5. The sample tube 4 is rotated at high speed, using a medium such as compressed air or nitrogen gas. A movable mechanism 10 such as a toothed wheel is used to vary the angle of the stator tube 5. A shaft 11 or other similar means is connected with the movable mechanism 10 to operate the movable mechanism 10 from outside.

A magic angle-adjusting controller 12 has an internal motor that is driven to move the shaft 11 via a flexible wire 13. A coupling 14 is mounted between the flexible wire 13 and the shaft 11 to connect them together. It suffices that the coupling 14 has only a coupling function. It is also possible to impart a speed-reducing mechanism including a worm gear to the coupling 14, thereby enhancing the rotational accuracy.

A control portion 15 sends instructions to the magic angle-adjusting controller 12. If a switch box is used as the control portion 15, a human operator inserts a KBr reference material for adjustment of the magic angle into the sample tube 4. The magic angle of the probe 3 (see FIGS. 9 and 10) is adjusted by remote control from the switch box while actually observing a spectrum from the $^{79}$Br nucleus, in order to make an adjustment for maximizing the spinning sidebands of KBr (see JP-A-2009-092424).

When a generally adopted magnetic field of 300 to 600 MHz is used in high-resolution solid-state $^{13}$C-NMR, it is said that the magic angle $\theta$ can be adjusted within a range of $\pm 0.5°$ with the adjusting sample KBr. In nuclear species having spin ½ such as $^{13}$C, the internal interactions (anisotropy of chemical shift interaction) are relatively small, i.e., on the order of kHz, and therefore, such a rough range of adjustment suffices. It is possible to withstand routine work by simple mechanical design and manual operations.

In high-resolution solid-state NMR of quadrupolar nuclei such as $^{17}$O and $^{27}$Al, which have found increasing applications in recent years, quadrupolar interactions are large and from hundreds of kHz to on the order of MHz. Spectral linewidth broadening due to error in setting the magic angle cannot be neglected. Consequently, an error range that is smaller than the above-described range by one, two, or more orders of magnitude is required. In MAS NMR of deuterium at natural abundance performed in the past by the present Applicant, it was necessary to restrict the error range to within $\pm 0.03°$ (see T. Mizuno et al., Journal of the American Chemical Society, Vol. 128, No. 30 (2006), pp. 9683-9686).

In a technique such as ST-MAS, a strict error range of within $0.004°$ was required in some cases when the magic angle was set. Achieving this strict range routinely with manual operations using the existing angular adjusting mechanism involves very large difficulties, because if a mechanical operation such as withdrawal of the probe which deteriorates the accuracy of the magic angle is performed, the experimental reproducibility is affected. Accordingly, there is a demand for a technique of easily and accurately controlling the magic angle without relying on the accuracy of a mechanical operation.

SUMMARY OF THE INVENTION

In view of the foregoing problem, the present invention has been developed. It is an object of the present invention to provide a method and apparatus for accurately adjusting the magic angle in NMR using numerical values of electric currents such as currents flowing through shim coils instead of manual operations for adjustment of the magic angle. It is another object of the invention to provide a method and apparatus for accurately adjusting the magic angle in a high-resolution solid-state NMR system using a solid-state NMR probe and incorporating vacuum pumping and cooling systems (e.g., a cryo-coil MAS) such as a solid-state DNP (dynamic nuclear polarization)-NMR spectrometer without relying on mechanical operations, the NMR system being so designed that if the sample tube angle were accurately adjusted mechanically, the vacuum adiabatic layer would be affected.

To achieve these objects, the present invention adopts the following configurations.

(1) A first embodiment of the present invention provides a method of accurately adjusting a magic angle in NMR using a solid-state NMR probe to perform NMR detection of a sample. An external magnetic field $B_0$ is applied along a Z-axis. A sample tube holding the sample therein is tilted at an angle of $\theta$ with respect to the Z-axis. Let Y-axis be a direction obtained by projecting the axis of rotation of the sample tube onto a plane perpendicular to the Z-axis. A uniform magnetic field coil assembly is placed to produce a uniform magnetic field along the Y-axis. A uniform magnetic field H is produced by controlling electric currents flowing through the uniform magnetic field coil assembly. The vector sum of the external magnetic field $B_0$ and the uniform magnetic field H is found. An angle determined by the vector sum is used to find a new external magnetic field $B_0'$. Under this condition, NMR detection is performed. The uniform magnetic field coil assembly is also known as a shim coil assembly.

(2) A second embodiment of the present invention provides an apparatus for accurately adjusting a magic angle in NMR using a solid-state NMR probe to perform NMR detection of a sample. An external magnetic field $B_0$ is applied along a Z-axis. The NMR probe has a sample tube holding the sample therein. The sample tube is tilted at an angle of $\theta$ with respect to the Z-axis. Let Y-axis be a direction obtained by projecting the axis of rotation of the sample tube onto a plane perpendicular to the Z-axis. The NMR probe further includes a uniform magnetic field coil assembly placed to produce a uniform magnetic field H along the Y-axis. The uniform magnetic field H is produced by controlling electric currents flowing through the uniform magnetic field coil assembly. The vector sum of the external magnetic field $B_0$ and the uniform magnetic field H is found. An angle determined by the vector sum is used to find a new external magnetic field $B_0'$. Under this condition, NMR detection is performed.

(3) A third embodiment of the invention provides an apparatus for accurately adjusting a magic angle using the uniform magnetic field coil assembly as set forth in (2) above, the uniform magnetic field coil assembly being made of windings of plural saddle coils.

(4) A fourth embodiment of the invention provides an apparatus for accurately adjusting a magic angle as set forth in (3) above, the apparatus being further characterized in that each of the saddle coils is a rectangular wire of copper having an insulating coating. The aspect ratio of the rectangular wire is 1:4 or higher. The cross section of the wire is 0.3 to 1.5 $mm^2$ (5) A fifth embodiment of the invention provides an apparatus for accurately adjusting a magic angle as set forth in (4) above, the apparatus being further characterized in that the insulating coating has a thickness that is equal to or less than 30 $\mu$m.

(6) A sixth embodiment of the invention provides an apparatus for accurately adjusting a magic angle as set forth in any one of (3)-(5) above, the apparatus being further characterized in that each of the saddle coils has a diameter that is 72.0±0.5 mm or less in cases where the coils have a wide bore and is 46.0±0.5 mm or less in cases where the coils have a narrow bore. The ratio of the diameter of the coil to the height is $\sqrt{2}:1$.

(7) A seventh embodiment of the invention provides an apparatus for accurately adjusting a magic angle as set forth in (2) above, the apparatus being further characterized in that at least one threaded hole permitting mounting of a radiator is formed in an upper portion of the bobbin of said sample tube.

(8) An eighth embodiment of the invention provides an apparatus for accurately adjusting a magic angle as set forth in any one of (3)-(7) above, the apparatus being further characterized in that the sample tube includes a bobbin having a cylindrical outer surface. Grooves conforming in shape with the coils are formed in the outer surface of the bobbin.

(9) A ninth embodiment of the invention provides an apparatus for accurately adjusting a magic angle as set forth in any one of (2)-(8) above, the apparatus being further characterized in that the sample tube includes a bobbin made of an aluminum-based metal.

The present invention yields the following advantages.

(1) According to the first embodiment of the present invention, the external magnetic field $B_0$ and the uniform magnetic field H are combined vectorially by generating the uniform magnetic field H. As a result, the external magnetic field is slightly tilted from the original magnetic field $B_0$, resulting in a magnetic field $B_0'$. Heretofore, the magic angle has been adjusted manually. According to the first embodiment, the adjustment can be made using numeric values of electric currents such as electric currents flowing through the shim coil assembly, which is used to generate the uniform magnetic field H as described in detail later.

(2) According to the second embodiment, the external magnetic field $B_0$ and the uniform magnetic field H are combined vectorially by generating the uniform magnetic field H. As a result, the external magnetic field is slightly tilted from the original magnetic field $B_0$, resulting in a magnetic field $B_0'$. Heretofore, the magic angle has been adjusted manually. According to the second embodiment, the adjustment can be made using numeric values of electric currents such as electric currents flowing through the shim coil assembly.

(3) According to the third embodiment, the saddle coils are used as the uniform magnetic field coil assembly. The uniform magnetic field coil assembly whose volume does not increase if the coils are wound multiple times can be accomplished.

(4) According to the fourth embodiment, a rectangular wire of copper having the insulating coating is used as the saddle coils. The wire is fabricated in desired dimensions. Consequently, the uniform magnetic field coil assembly whose volume does not increase if the coils are wound multiple times can be accomplished.

(5) According to the fifth embodiment, the uniform magnetic field coil assembly whose volume does not increase if the coils are wound multiple times can be accomplished by setting the thickness of the insulating coating of the rectangular wire to 30 $\mu$m or less.

(6) According to the sixth embodiment, an ideal uniform magnetic field coil assembly can be achieved by fabricating the saddle coils in desired dimensions.

(7) According to the seventh embodiment, a radiator can be mounted by forming the at least one threaded hole in the upper part of the bobbin of the sample tube. Heat generated by flow of electric currents through the uniform magnetic field assembly can be suppressed.

(8) According to the eighth embodiment, the uniform magnetic field coil assembly can be fitted in the grooves that conform in shape with the coils by forming the grooves in the outer cylindrical surface of the bobbin of the sample tube. The uniform magnetic field coil assembly can be held in the bobbin.

(9) According to the ninth embodiment, the probe RF circuit can be protected against external disturbances by making the bobbin from an aluminum-based metal. Heat generated from the shim coil assembly due to the applied current can be dissipated away without affecting the resolution of the NMR signal. Distortion of the coil shape due to Lorentz force can be suppressed.

Other features and advantages of the present invention will become apparent from the following more detailed descrip-

DESCRIPTION OF THE PREFERRED EMBODIMENT(S)

Figure 1:
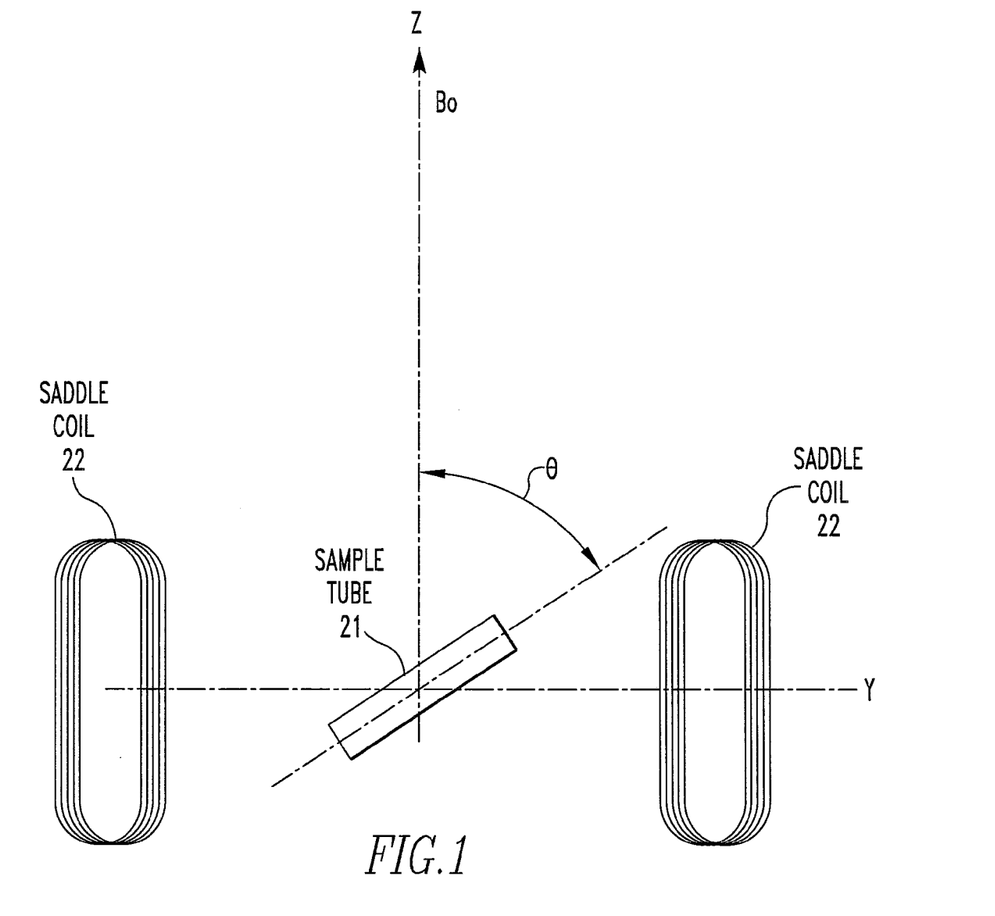
FIG. 1 is a schematic view of main portions of an accurate magic angle-adjusting apparatus according to the present invention.

The preferred embodiments of the present invention are hereinafter described in detail with reference to the accompanying drawings. FIG. 1 shows main portions of an accurate magic angle-adjusting apparatus according to the present invention. A sample is put in a sample tube 21. An intense external magnetic field $B_0$ is produced in the direction of the Z-axis. Therefore, it is necessary to supply a large current into a coil for producing the magnetic field. For this purpose, a superconducting coil may be used. The sample tube 21 is tilted at an angle of $\theta$ with respect to the Z-axis. The angle $\theta$ is known as the magic angle and approximately 54.74° (satisfying the relationship: $3\cos^2\theta - 1 = 0$). The magic angle is previously computationally found on the assumption that it minimizes the linewidth of solid-state NMR resonance lines arising from anisotropic internal interactions of nuclear spins and consequently maximizes the detection sensitivity.

Let Y-axis be a direction obtained by projecting the axis of rotation of the sample tube 21 onto a plane perpendicular to the Z-axis. A saddle coil 22, which is also known as a shim coil, is used to produce a uniform magnetic field H in the Y-axis direction. The saddle coil is made of a rectangular wire to produce the uniform, stable magnetic field H. The cross section of the rectangular wire is square or rectangular in shape. Since the saddle coil 22 is made of a rectangular wire, the uniform magnetic field H can be produced.

Figure 2A:
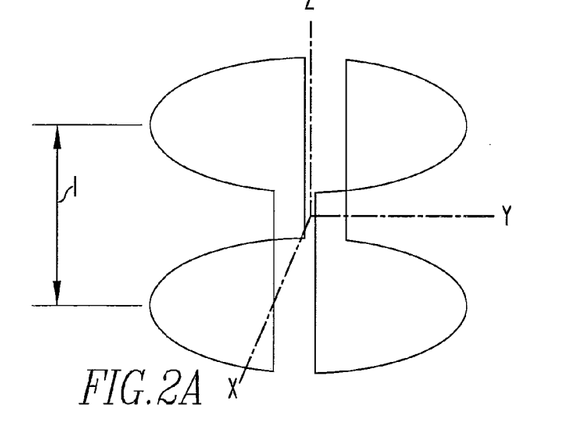
FIGS. 2A, 2B, and 2C show the structure of each saddle coil shown in FIG. 1.
Figure 2B:
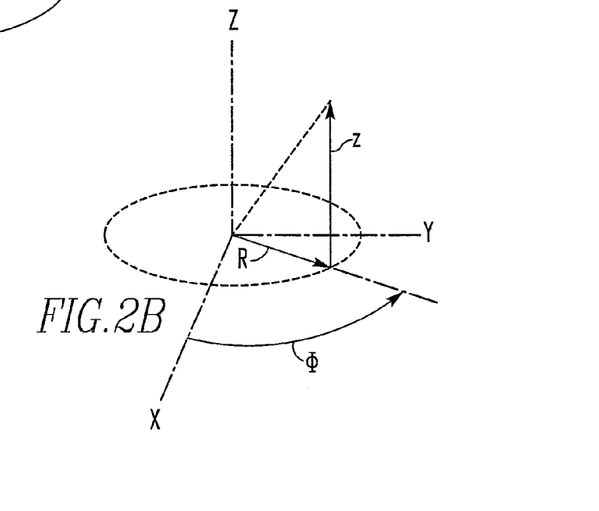
Figure 2C:
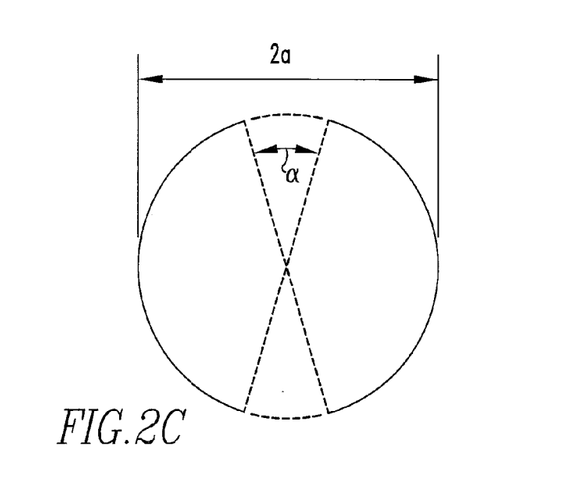

FIGS. 2A, 2B, and 2C show one example of a structure of the saddle coil. In this schematic figure, the saddle coil and parameters indicating the dimensions of the coil are shown. FIG. 2A indicates the relation of the saddle coil to a Cartesian coordinate system (X, Y, Z). FIG. 2B indicates the relation between the Cartesian coordinate system (X, Y, Z) and a cylindrical coordinate system (R, $\phi$, z). FIG. 2C is a view of the saddle coil as viewed from the Z-axis direction. The saddle coil has a radius of a and a height of l. In the coil, an arcuate component makes an angle of $\alpha$. A single turn of the saddle coil is defined and shown in the left upper part.

A bobbin is mounted in the outermost portion of the probe and held to the body of the probe. Using the bobbin as a form, a Helmholtz saddle coil is mounted. Where a saddle coil of this construction is used, a magnetic field $B_y$ in the Y-direction created around the space of the sample is given by $$B_y = \frac{2n\mu_0 lI}{\pi a}\left\{\frac{1}{(a^2+l^2)^{1/2}} + \frac{a^2}{(a^2+l^2)^{3/2}}\right\}\cos\alpha \quad (1)$$

where a is the radius of the saddle coil, l is the height, I is the current flowing through the coil, n is the number of turns, $\alpha$ is the angle of the arcuate component, and $\mu_0$ is the vacuum permeability.

It is now assumed that the probe is a wide-bore probe. The present saddle coil was dimensioned and shaped such that a=30 mm, l=42.4 mm, and $\alpha$=15°. The coil was made of oxygen-free round copper wire having a diameter of 1 mm. The number of turns was 50 (n=50). The Y-direction magnetic field $B_y$ necessary to tilt the sample tube by 0.05° was $B_y$=6.19×10$^3$T. The required current was 4.4 A.

Figure 3:
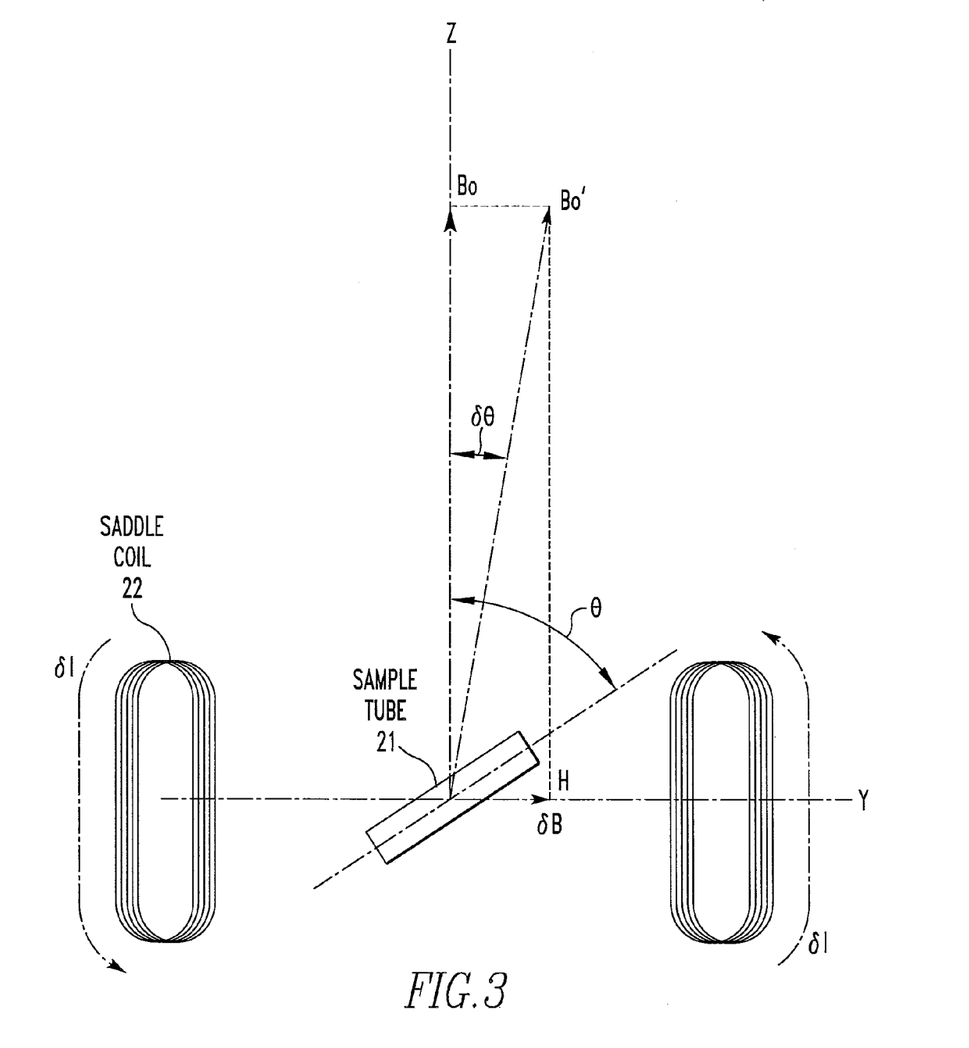
FIG. 3 illustrates the operation of the apparatus shown in FIG. 1.
Figure 4A:
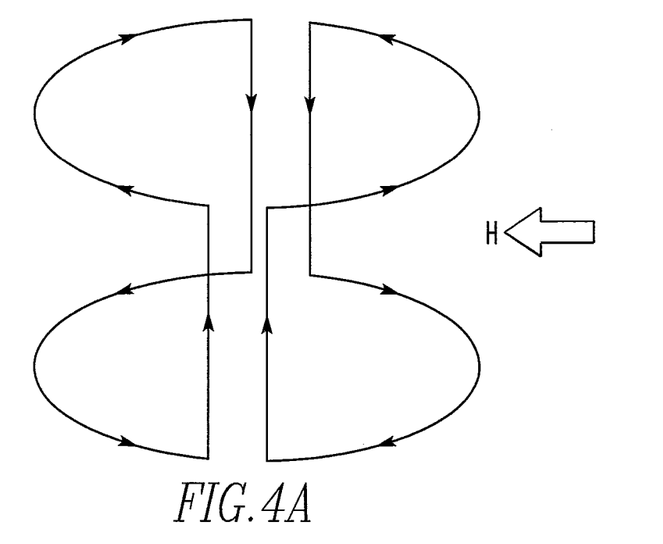
FIGS. 4A and 4B are diagrams illustrating the relationship between the sense of electric current flowing through each saddle coil and the generated magnetic field.
Figure 4B:
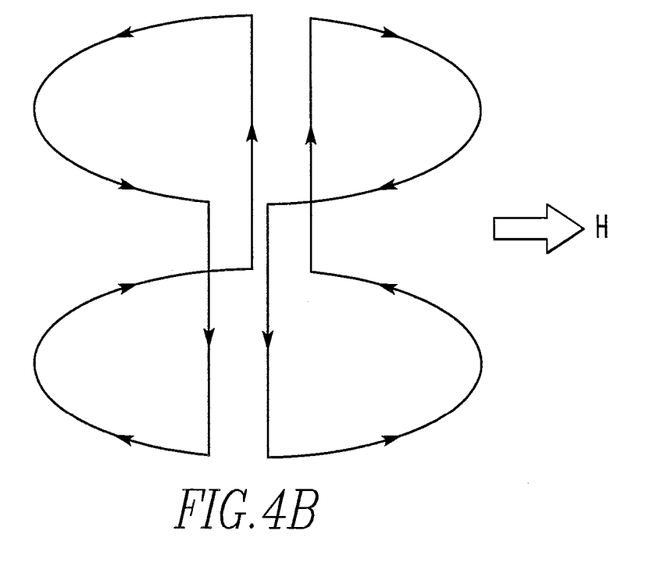

FIG. 3 illustrates the operation of the present invention. In both FIGS. 1 and 3, like components are indicated by like reference numerals. The uniform magnetic field H is applied in the + (positive) Y-direction by the Y-axis uniform magnetic field coil (saddle coil) 22, the field H having a magnetic flux density that is about 1/100 to 1/1000 of the external magnetic field $B_0$. FIGS. 4A and 4B illustrate the relation between the sense of the current flowing through the saddle coil and the produced magnetic field. When the saddle coil 22 is energized with current δI flowing in the sense as shown in FIG. 4A, the uniform magnetic field H is produced such that it is directed to the left (negative direction) as shown. When the coil 22 is energized with current δI flowing in the sense as shown in FIG. 4B, the uniform magnetic field H is produced such that it is directed to the right (positive direction) as shown.

When the magnetic field is applied in the + (positive) direction, the total external magnetic field felt by the sample in the sample tube 21 is the vector sum of the Z-direction external magnetic field $B_0$ and the Y-direction uniform magnetic field H (δB) produced from the uniform magnetic coil 22 by energizing it with the current δI. Therefore, the sample tube tilts by angle δθ within the Y-Z plane. That is, the external magnetic field $B_0$ and the Y-direction uniform magnetic field H (=δB) are combined vectorially to give rise to a new external magnetic field $B_0'$.

Figure 5:
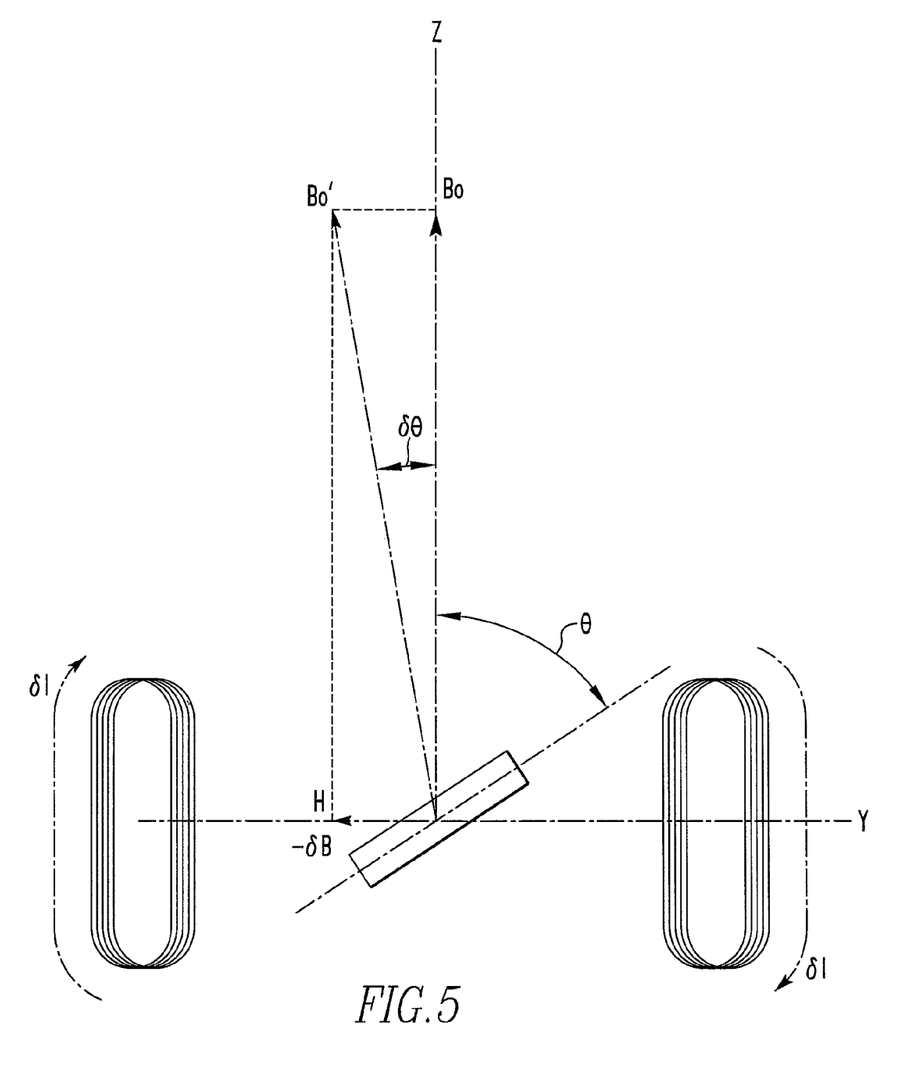
FIG. 5 illustrates the operation of the apparatus shown in FIG. 1.

Similarly, the uniform magnetic field H having a magnetic flux density that is smaller than the external magnetic field $B_0$ by a factor of about 100 to 1,000 is applied in the − (negative) Y-direction by the Y-axis uniform magnetic coil (saddle coil) 22 as shown in FIG. 5. That is, it is assumed that the magnetic field H produced when the magnetic coil 22 is energized with the current δI assumes a value of δB. At this time, the total external magnetic field felt by the sample in the sample tube 21 is the vector sum of the external magnetic field $B_0$ in the Z-direction and the uniform magnetic field H (=δB) in the Y-direction and, therefore, the sample tube 21 is tilted by angle δθ within the Y-Z plane. That is, the new external magnetic field $B_0'$ is a vectorial combination of the external magnetic field $B_0$ and the uniform magnetic field H (=δB) directed in the Y-direction as shown.

Accordingly, the angle θ made between the sample tube 21 and the external magnetic field can be electrically controlled within the range of ±δθ by controlling the intensity of the uniform magnetic field H in the ±Y-directions depending on the sense of the current δI flowing through the Y-axis uniform magnetic field coil 22. This method involves no mechanical operation at all. Therefore, it is theoretically possible to accurately control the angle θ (including the magic angle) up to the experimentally required accuracy without affecting the rotation of the sample tube 21.

In the present invention, the uniform magnetic field coil is energized with a steady current such as a shim coil. During NMR measurements, the current is not controlled to vary rapidly such as in solution NMR spectroscopy where gradient pulses are used. Consequently, it is not necessary to take account of the effects of transient phenomena on the spectral resolution.

The present invention can also be utilized for accurate angle adjustment using a saddle coil made of an alpha winding, plural layered, rectangular wire mounted on the outer surface of the probe.

Figure 6A:
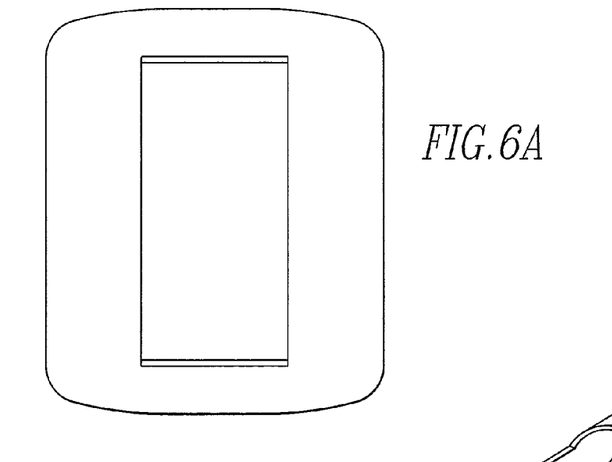
FIGS. 6A, 6B, 6C, and 6D are three-dimensional projection views of a saddle coil using rectangular wire.
Figure 6B:
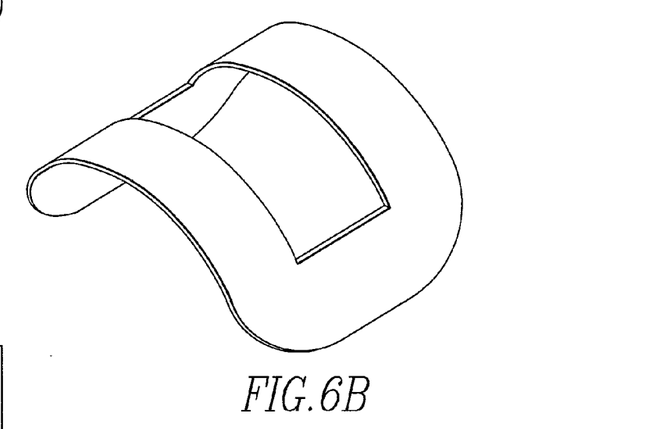
Figure 6C:
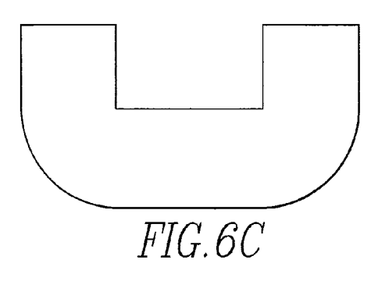
Figure 6D:
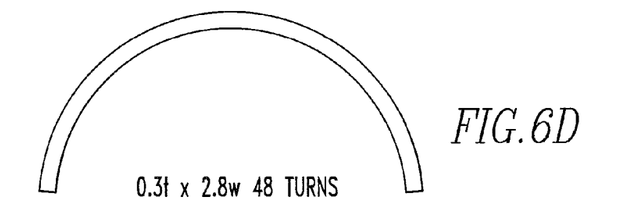

FIGS. 6A, 6B, and 6C are three-dimensional projection views of a saddle coil 22 using a rectangular wire having a thickness (t) of 0.3 mm and a width (w) of 2.8 mm. The number of turns is 48.

FIGS. 7A to 7E show the shape of a bobbin, indicated by 21a. Indicated by 22 are saddle coils. The bobbin is made of an aluminum-based metal to protect the probe RF circuit against external disturbances. Also, heat generated from the shim coil caused by application of electric current is dissipated away without affecting the resolution of the NMR signal. Furthermore, distortion of the coil shape due to Lorentz force can be suppressed.

Figure 7A:
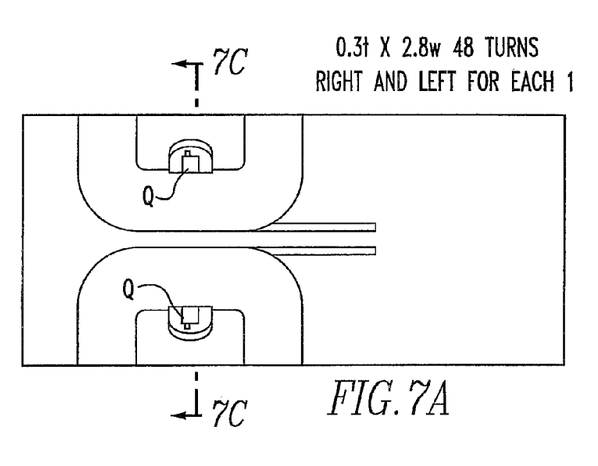
FIGS. 7A-7E show the shape of a bobbin.
Figure 7B:
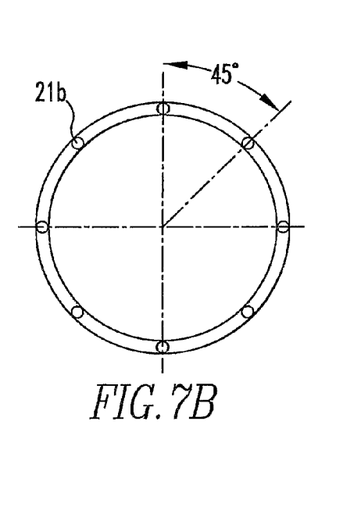
Figure 7C:
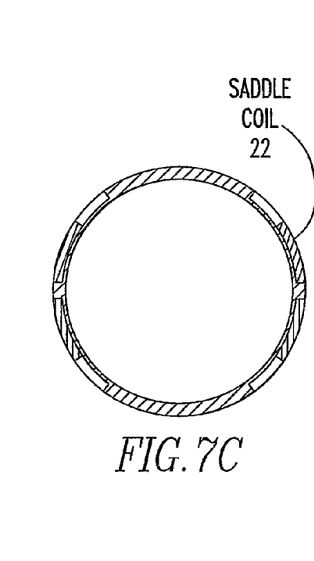
Figure 7D:
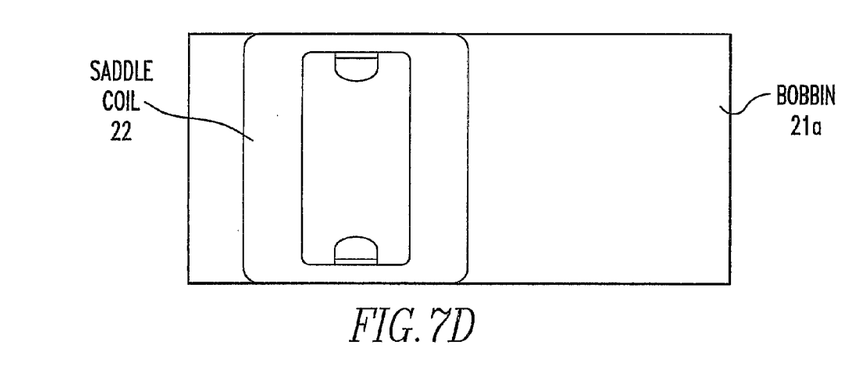
Figure 7E:
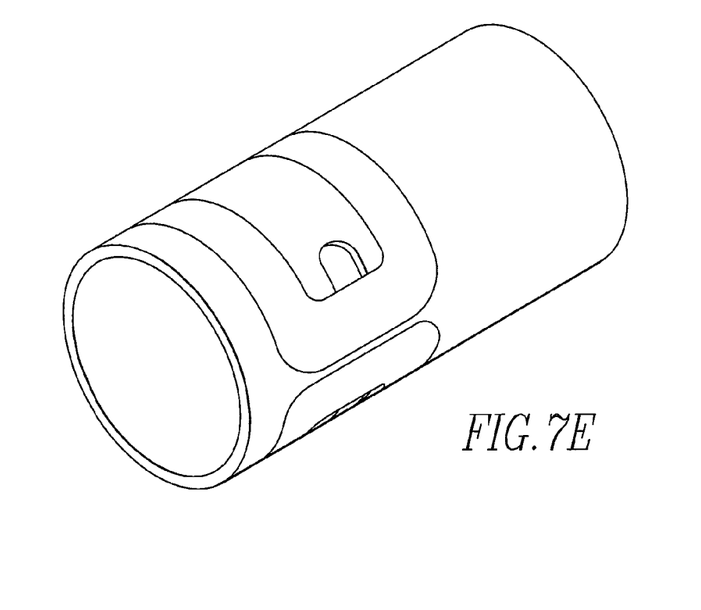

Grooves (not shown) are cut in the portions of the bobbin 21a on which the saddle coils 22 are mounted to permit the coils 22 to be mounted on the bobbin 21a securely. FIG. 7A and FIG. 7D are side elevations. FIG. 7B is a top view. FIG. 7C is a cross section taken on line A-A. FIG. 7E is a perspective view. As shown in FIG. 7A, the two saddle coils 22 are used in the left and right portions, respectively. The leading portions of the windings are connected together in spaces Q. Each saddle coil 22 has a thickness (t) of 0.3 mm and a width (w) of 2.8 mm. The number of turns of wire is 48. The internal leading portions of the left and right coils are connected together to form one saddle coil assembly. Threaded holes 21b are cut in the upper surface of the bobbin 21a of the sample tube 21 to permit mounting of a radiator. This in turn can suppress heat generated by electrical energization of the uniform magnetic field coil assembly.

The present invention yields the following advantages.

1) Low Development Cost.

The configuration necessary for the apparatus of the present invention is very simple and only composed of rectangular-wire coils, bobbin, and a commercially available regulated power supply. The apparatus can be introduced as a detachable option on the top of a high-resolution solid-state NMR probe. For example, the apparatus is mounted on the cylindrical cover in the magnetic field insertion portion of the probe. Alternatively, the apparatus is mounted on a jacket for solution samples or mounted inside a room-temperature shim coil. Because the apparatus can be introduced with little modifications to the existing design, the development cost is low.

2) High Versatility.

The present invention permits an accurate, high-reproducibility optimization process for adjustment of the magic angle (i.e., optimization of the spectral resolution) to be carried out routinely without performing manual operations, the process being common to all high-resolution solid-state NMR techniques whether the probe is of the wide bore type or narrow bore type. Thus, great versatility is provided. The present invention is especially useful for samples that require very accurate adjustment of the magic angle in high-resolution spectral measurements (i.e., there are highly anisotropic interactions (such as quadrupolar interactions of $^2$H and $^{14}$N and chemical shift interactions of $^{129}$Pt).

3) Generalization of the Revolutionary Action (ST-MAS) of Quadrupolar Nuclear NMR.

The ST-MAS experimentation developed in recent years has been valued for its usefulness as a high-resolution solid-state NMR methodology of inorganic materials (quadrupolar nuclei). However, since accuracy and reproducibility better than 0.001° are required in setting the magic angle, the versatility remains low. The present invention permits ST-MAS to be performed accurately and with high reproducibility. As a result, the values of the whole solid-state NMR spectrometer are enhanced. Consequently, its value on the market is high.

4) It is Possible to Assure the Performance of Special MAS-NMR Probes Such as Cryo-Coil MAS Probes.

Cryo-coil MAS intended for intrinsic improvement of sensitivity of high-resolution solid-state NMR involves complex and elaborate mechanical design and, therefore, it is difficult to achieve accurate adjustment of the magic angle by mechanical operations. For the same reason, when a special MAS-NMR probe for use in harsh or extreme experimental environments (such as high temperature, quite low temperature, high pressure, or vacuum environments) is used, it is often impossible or very difficult to adjust the magic angle. The present invention makes it possible to adjust the magic angle without using any mechanism such that the functions of optimization of resolution offered by these special MAS-NMR probes can be assured.

Having thus described our invention with the detail and particularity required by the Patent Laws, what is desired protected by Letters Patent is set forth in the following claims.

The invention claimed is:

1. A method of accurately adjusting the magic angle in a solid state NMR probe and using a solid-state NMR probe to perform NMR detection of a sample, said method comprising the steps of:

applying an external static magnetic field $B_0$ along a Z-axis;

placing a sample tube holding the sample therein such that the sample tube is tilted at an angle of θ with respect to the Z-axis and rotates about its axis of rotation which, when it is projected onto a plane perpendicular to the Z-axis, forms a Y-axis;

placing a uniform magnetic field coil assembly for producing a uniform magnetic field along the Y-axis;

producing a uniform static magnetic field H by controlling electric direct currents flowing through the uniform magnetic field coil assembly;

finding an adjusted external static filed $B_0'$ which is given by a vector sum of the external static magnetic field $B_0$ and the uniform magnetic field H corresponding to the magic angle; and performing NMR detection of said sample using a new external static magnetic field $B_0'$ given by an angle determined by the vector sum.

2. An apparatus for accurately adjusting the magic angle in a solid state NMR probe and using a solid-state NMR probe to perform NMR detection of a sample, said apparatus comprising:

means for applying an external static magnetic field $B_0$ along a Z-axis;

a sample tube holding the sample therein, the sample tube being tilted at an angle of θ with respect to the Z-axis, the sample tube rotating about its axis of rotation which, when it is projected onto a plane perpendicular to the Z-axis, forms a Y-axis;

a uniform static magnetic field coil assembly placed and energized with controlled electric direct currents to produce a uniform static magnetic field H along the Y-axis;

means for finding an adjusted static filed $B_0'$ which is given by a vector sum of the external static magnetic field $B_0$ and the uniform static external magnetic field H corresponding to the magic angle; and means for performing NMR detection using a new external static magnetic field $B_0'$ given by an angle determined by the vector sum.

3. An apparatus for accurately adjusting a magic angle in NMR as set forth in claim 2, wherein plural saddle coils are wound as said uniform magnetic field coil assembly.

4. An apparatus for accurately adjusting a magic angle in NMR as set forth in claim 3, wherein each of said saddle coils is made of a rectangular wire of copper having an insulating coating, and wherein the rectangular wire has an aspect ratio of 1:4 or higher and a cross section of 0.3 to 1.5 mm².

5. An apparatus for accurately adjusting a magic angle in NMR as set forth in claim 4, wherein said insulating coating has a thickness of 30 μm or less.

6. An apparatus for accurately adjusting a magic angle in NMR as set forth in claim 2, wherein at least one threaded hole permitting mounting of a radiator is formed in an upper portion of a bobbin of said sample tube.

7. An apparatus for accurately adjusting a magic angle in NMR as set forth in any one of claims 3 to 5, wherein each of said saddle coils has a diameter of 72.0±0.5 mm or less in cases where the coils have a wide bore and is 46.0±0.5 mm or less in cases where the coils have a narrow bore, and wherein the ratio of the diameter of the coil to the height is $\sqrt{2}:1$.

8. An apparatus for accurately adjusting a magic angle in NMR as set forth in any one of claims 3 to 5, wherein a bobbin of said sample tube has a cylindrical outer surface provided with grooves conforming in shape with the coils.

9. An apparatus for accurately adjusting a magic angle in NMR as set forth in any one of claims 2 to 5, wherein a bobbin of said sample tube is made of an aluminum-based metal.

* * * * *